United States Patent [19]

Kaneko et al.

[11] Patent Number: 5,223,077
[45] Date of Patent: Jun. 29, 1993

[54] METHOD OF MANUFACTURING SINGLE-CRYSTAL SILICON

[75] Inventors: Kyojiro Kaneko, Ibaraki; Hideyuki Mizumoto, Kadoma, both of Japan

[73] Assignee: Osaka Titanium Co., Ltd., Hyogo, Japan

[21] Appl. No.: 684,174

[22] Filed: Apr. 12, 1991

[30] Foreign Application Priority Data

Apr. 27, 1990 [JP] Japan .................................. 2-112050

[51] Int. Cl.⁵ .............................................. C30B 15/00
[52] U.S. Cl. .................................. 156/620.4; 156/600; 156/601; 156/617.1; 156/618.1; 156/619.1; 156/DIG. 64; 156/DIG. 102; 156/DIG. 103
[58] Field of Search ................... 156/617.1, 600, 618.1, 156/601, 619.1, 620.4, DIG. 64, DIG. 102, DIG. 103

[56] References Cited

U.S. PATENT DOCUMENTS

| | | | |
|---|---|---|---|
| 4,090,851 | 5/1978 | Berkman et al. | 156/DIG. 83 |
| 4,224,100 | 9/1980 | Hartzell | 156/DIG. 83 |
| 4,361,114 | 11/1982 | Gurev | 118/723 |
| 4,515,755 | 5/1985 | Matsuo et al. | 156/620.4 |
| 4,874,458 | 10/1989 | Nishizawa | 156/618.1 |

FOREIGN PATENT DOCUMENTS

2-30698 of 0000 Japan .
1-264920 10/1989 Japan .

*Primary Examiner*—Robert Kunemund
*Assistant Examiner*—Felisa Garrett
*Attorney, Agent, or Firm*—Oblon, Spivak, McClelland, Maier & Neustadt

[57] ABSTRACT

A single crystal silicon is prepared by providing a silicon melt reservoir formed of an induction coil coated on its internal surfaces with a high melting insulating material which is subjected to an electromagnetic field which heats silicon placed in said melt reservoir, melting silicon in the melt reservoir by the application of the electromagnetic field and simultaneously depositing a scull layer of silicon on the inner surface of said reservoir, and pulling up a single crystal silicon rod from the silicon melt in the melt reservoir.

10 Claims, 2 Drawing Sheets

METHOD OF MANUFACTURING SINGLE-CRYSTAL SILICON

BACKGROUND OF THE INVENTION

1. Field of the Invention

The present invention relates to a method of manufacturing single-crystal silicon by the Czochralski pulling method (hereinafter called the CZ method).

2. Description of the Background

Single-crystal silicon is an essential element in the manufacture of various semiconductors and highly effective solar batteries and can be obtained industrially by the CZ method, wherein the single-crystal silicon is pulled up from a silicon melt. Another known method of manufacture is the floating zone method (the FZ method) in which a polycrystalline silicon rod is inserted into an induction coil to create single-crystal silicon. The CZ method is regarded as economical, because it requires less processing and because it provides a more profitable yield than the FZ method. However, the CZ method does not achieve single-crystal silicon of a quality equivalent to that obtained by the FZ method, mainly because of the fact that the resultant single-crystal silicon is contaminated by impurities from the worn quartz crucible containing the silicon melt.

Also, the continuous pulling of a single-crystal silicon rod for hours is a matter of course in the CZ method, since the continuous pulling may allow the single-crystal silicon rod to have a constant specific resistance in principle, thereby largely improving yield and achieving greater efficiency of furnace operation. However, no fully satisfactory continuous pulling operation is known in achieving these objectives primarily because of wear of the quartz crucible similar to deterioration of the quality of single-crystal silicon.

The introduction of an electromagnetic melting step into the CZ method has been recently watched with keen interest in light of the above objectives. The electromagnetic melting process is a kind of floating melting method, which uses a circumferentially divided water-cooled conductive crucible for melting a material placed therein as it floats through an electromagnetic field. The principle has been adopted in a polycrystalline silicon manufacturing apparatus as disclosed in Japanese Unexamined Patent Application Nos. 52962/1986, 264920/1989 and 30698/1990 and the like. The electromagnetic melting process may be employed in the CZ method thereby allowing a silicon melt placed in a crucible to be kept away from the inner surfaces of the crucible, in order to substantially reduce wear of the crucible in principle, thereby preventing the single-crystal silicon from being polluted by impurities from the crucible which ensures that the resultant single-crystal silicon has a quality equivalent to that obtained by the FZ method and which enables continuous pulling of single-crystal silicon for hours.

The above technique, however, has many problems and has not yet been practically used on an industrial basis. One of the factors hindering industrialization of the CZ method using the electromagnetic process is an agitation phenomenon of the silicon melt which is in the crucible, as the melt is kept away from the inner surface of the crucible. That is, when the induction frequency is high in the electromagnetic silicon melting process, current efficiency increases while the skin effect is also largely developed, so that eddy currents do not reach the central portion of the silicon placed in the crucible which results in an insufficient melting of the silicon in the central portion of the silicon melt. Hence, in order to make an enlarged single-crystal silicon rod, presently a lower induction frequency band width of practically 2 to 3 KHz is required. When the lower frequency band width is selected, the current acts deeply through the surface of the melted silicon to generate an electromagnetic force through cooperation of the current and a magnetic field, thereby causing a silicon melt which is placed in the crucible to be subjected to an intensive agitation force. The silicon melt which is kept in a floating state in the crucible is strongly agitated and forms waves on its liquid surface, thereby causing a single-crystal silicon rod pulled up from the silicon melt to have a swirl defect, dislocation and the like because of temperature fluctuations. In addition, the CZ method using the conventional electromagnetic melting process consumes almost half of the applied electric power to heat the crucible, so that it is not a very economical technique as expected in spite of the fact that silicon is heated directly by eddy currents. A need therefore continues to exist for improvements in the CZ method of forming single crystal silicon.

SUMMARY OF THE INVENTION

Accordingly, one object of the present invention is to provide a method of manufacturing single-crystal silicon with a particularly higher power consumption efficiency in comparison to the conventional CZ method which uses electromagnetic melting and which does not agitate the silicon melt.

Briefly, this object and other objects of the present invention as hereinafter will become more readily apparent can be attained in a method for preparing single-crystal silicon, by providing a silicon reservoir formed of an induction coil coated on its internal surfaces with a high-melting insulating material, which is subjected to an electromagnetic field which heats silicon placed in the melt reservoir, melting silicon in said reservoir by the application of the electromagnetic field and simultaneously depositing a scull layer of silicon on the inner surface of the melt reservoir, and pulling up a single-crystal silicon rod from the silicon melt in said melt reservoir.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

The method of manufacturing single-crystal silicon of the present invention employs a melt reservoir which serves also as an induction coil. The electromagnetic field developed by the induction coil affects silicon in the melt reservoir directly but not through the crucible, and improves the efficiency of electric power consumption by a factor of almost twice that of the conventional CZ method using the electromagnetic melting process.

When silicon which is placed in the melt reservoir, serving also as the induction coil, is melted, the silicon melt is brought into contact with the inner surface of the melt reservoir. Silicon, as it is heated, decreases in specific resistance and makes a good conductor in its liquid form so that when the silicon melt directly contacts the induction coil, the induction coil is short-circuited. In the manufacturing technique of the present invention for preparing single-crystal silicon, the induction coil is coated on its inner surface with an insulating material, so that the induction coil does not short-circuit and the silicon melt is cooled by the melt reservoir and solidifies, thereby forming a skull layer of silicon over the inner surface of the melt reservoir.

The scull layer of silicon protects the melt reservoir and prevents the silicon melt inside the scull layer of silicon from being contaminated by the insulating material which covers the inner surface of the induction coil. In addition, the silicon melt inside the scull layer of silicon adheres thereto, so that the silicon melt in the crucible, even when subjected to an intensive stirring force, does not exhibit the agitation phenomenon normally exhibited by a silicon melt when kept in a floating state. Hence, the present method ensures a high quality single-crystal silicon rod as it is pulled from the silicon melt.

Figure 1:
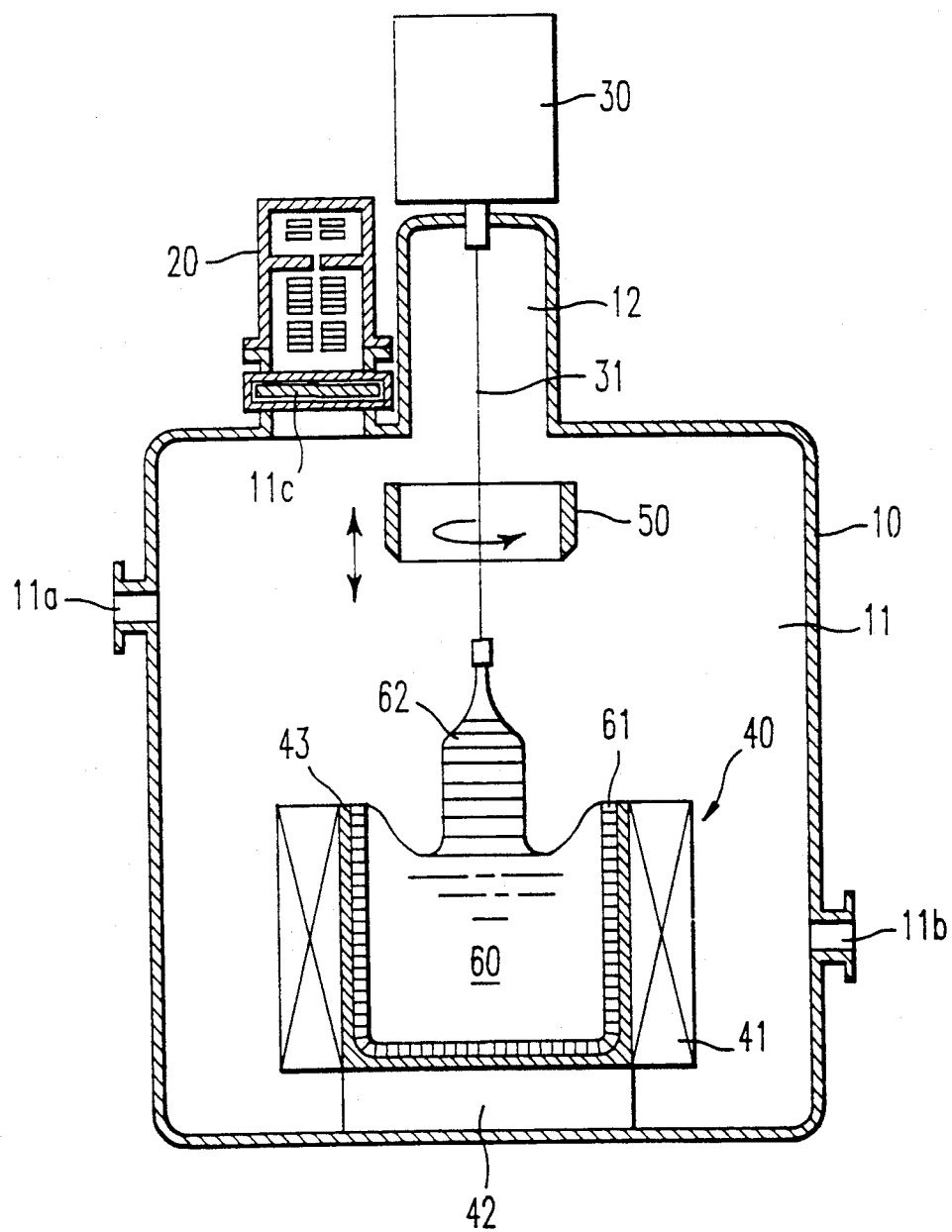
FIG. 1 is a schematic sectional view of an apparatus useful for practicing the method of the present invention.

FIG. 1, as an embodiment of the invention, is a schematic sectional view of an apparatus suitable for use in the technique of the present invention.

The apparatus shown in FIG. 1 comprises an airtight casing 10 containing therein a melt reservoir 40 and a magnetic shield 50. The airtight casing 10 has a cylindrical melt chamber 11 and a pulling chamber 12 projecting upwardly and coaxially thereof. The melt chamber 11 is provided with an inactive gas introduction port 11a and an inactive gas exhaust port 11b, and at the upper part with an electron beam gun 20 having a vacuum valve 11c. A pull means 30 having a wire 31 is disposed above the pulling chamber 12.

Figure 2:
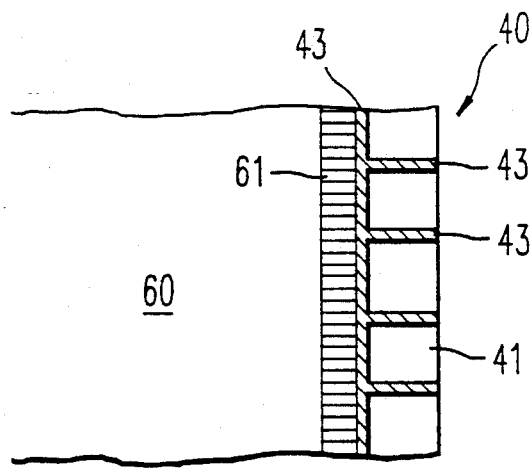
FIG. 2 is an enlarged sectional view of a part of the melt reservoir.

The melt reservoir 40 is disposed axially centrally in the melt chamber 11 of the airtight casing 10 and is provided with an annular induction coil 41 and a disc-like shaped fireproofing bottom plate 42 for closing the bottom of the coil 41. An insulating layer 43 covers the inner peripheral surface of the induction coil 41 and the upper surface of the fireproofing bottom plate 42. The insulating layer 43 is made of a silicon compound of a higher melting point than silicon such as $Si_3N_4$, $SiO_2$ or the like and is also interposed between coils of the induction coil 41 (see FIG. 2). The thickness of the insulating layer 43 on the inner surface of the melt reservoir is preferably 0.15 mm or more and is not required to be more than 0.25 mm.

The electron beam gun 20 is adapted to direct an electron beam into the melt reservoir 40.

The magnetic shield 50 is an annular member made of a water-cooled conductive material such as aluminum, copper or the like, or molybdenum, graphite or the like, each of which is not water-cooled and has an outer diameter slightly smaller than the inner diameter of the reservoir 40, so that the magnetic shield 50 is moved up and down in the melt chamber 11 and inserted into the melt reservoir 40 through its upper opening when required.

In the actual method of the invention, blocks or granules of silicon formed of polycrystalline silicon are placed in the melt reservoir 40 with the magnetic shield 50 being withdrawn over the reservoir. Then, the airtight casing 10 is evacuated through the exhaust port 11b to a degree of vacuum required for application of the electron beam, and the electron beam gun 20 is activated to direct an electron beam to the silicon material placed in the melt on reservoir 40 which causes the silicon material to partially melt, while the induction coil 41 of the reservoir 40 is excited. The induction coil 41 is properly water-cooled.

Excitation of the induction coil 41 causes an electromagnetic field to affect directly the silicon material in the reservoir 40. The silicon material, when in a solid state, does not have eddy current enough to allow the silicon material to melt. An electron beam is directed to the silicon material to form therein a pool through which a sufficient eddy current flows, and the pool starts to enlarge as it emits heat (Joule's heat). When a predetermined amount of molten silicon forms, the application of the electron beam is stopped.

When the silicon material in the melt reservoir 40 melts, a silicon melt 60 is brought into contact with the inner surface of the reservoir 40. The inner surface of the induction coil 41 is covered with the insulating layer 43 to keep the silicon melt 60 from directly contacting the induction coil 41. Hence, the induction coil 41 is not short-circuited by the silicon melt 60, and the silicon melt 60 is cooled and the portion thereof in contact with the inner surface of the melt reservoir solidifies thereby forming a silicon skull layer 61 which acts as an insulation layer and does not dissolve without the presence of Joule's heat. When required, a silicon material is supplied into the melt reservoir 40 through a hopper (not shown) provided in the airtight casing 10.

When the melt reservoir 40 contains the silicon melt 60, the pull means 30 is activated to pull upward wire 31 to which the silicon melt 60 adheres and the wire is turned. The molten silica solidifies in a cylindrical shape on the liquid surface thereby forming a single-crystal silicon rod 62. At any proper stage after completion of application of the electron beam, an inert gas such as argon or the like is introduced through the gas introduction port 11a into the airtight casing 10 to elevate the pressure inside to atmospheric pressure.

The manufacturing method according to the present invention has the following advantages in comparison with the conventional CZ method using the electromagnetic melting process.

The melt reservoir 40 includes the induction coil 41 as an essential component, so that an electromagnetic field generated by the induction coil 41 directly affects the silicon placed in the reservoir 40. Hence, the present method improves power consumption efficiency by two times that of the conventional method which interposes a water-cooled crucible between silicon and the induction coil.

The melt reservoir 40 is protected by the skull layer 61 of silicon, so that the reservoir 40 is worn in a manner substantially similarly to the wear which occurs in the conventional method which keeps a silicon melt in a floating state in the water-cooled crucible.

The insulating layer 43, which serves as an inner layer of the melt reservoir 40, is formed of a silicon compound higher-melting than silicon, so that the insulating layer 43 itself is less likely to contaminate silicon. Also, the solidified skull layer 61 of silicon of the silicon melt 60, which layer intervenes between the insulating layer 43 and the silicon melt 60, prevents the single-crystal silicon from being contaminated by an impurity from the melt reservoir 40 to a level of contamination equivalent to the conventional method wherein the silicon melt is kept floating in the water-cooled crucible.

The bottom and outer peripheral surfaces of the silicon melt 60 in the melt reservoir 40 adhere to the skull layer 61 silicon, so that the silicon melt 60 is not agitated as conventionally by an intensive stirring force which is generated at low frequency operation, thereby restraining the liquid surface of the silicon melt 60 from developing waves, thereby largely eliminating the swirl defect, dislocations and the like of a single-crystal rod 62 obtained from the silicon melt 60 in comparison to the conventional method.

When the silicon melt 60 is stirred which causes waves to form on the liquid surface, the magnetic shield 50 is moved down into the melt reservoir 40 thereby approaching the liquid surface of the silicon melt 60 and continues to gradually move downward as the surface of the liquid drops as the single-crystal silicon rod 62 is pulled up from the melt, so that the liquid surface of the silicon melt 60 can be almost perfectly prevented from forming waves during the pulling operation of the single-crystal silicon rod 62 to further improve the quality thereof.

The present method uses the application of the electron beam for the initial and partial melt of the silicon material in the dissolution reservoir 40 prior to the application of the electromagnetic melting process. In the conventional method, as disclosed in the aforesaid Japanese Unexamined Patent Applications Nos. 264920/1989 and 30698/1990, a high-melting conductor such as graphite, molybdenum or the like is brought into contact with silicon placed in the melt container, while an electromagnetic field is excited in the container to first heat the high melting conductor and to thereby form a pool of silicon surrounding the conductor by heat. Hence, the initial melting process of the conventional method does not prevent contamination of the single-crystal silicon rod by impurities from the high-melting conductor. The initial melting process of the present invention, using the application of the electron beam, can prevent contamination with impurities and further improves the quality of the single-crystal rod 62.

Accordingly, the manufacturing method for single-crystal silicon of the present invention provides single-crystal silicon of improved quality in comparison to the conventional CZ method which uses an electromagnetic dissolution process.

Polycrystalline silicon granules manufactured by fluidized-bed granulation ma be preferably used as the silicon material for ease of loading.

Having now generally described this invention, a further understanding can be obtained by reference to certain specific examples which are provided herein for purposes of illustration only and are not intended to be limiting unless otherwise specified.

A single-crystal silicon rod 50 mm in diameter was manufactured according to CZ method with the direct melting process using the apparatus shown in FIG. 1. The initial melting process was conducted two ways using graphite and an electron beam, respectively. The magnetic shield was not used. Table 1 shows the requirements for the magnetic and pulling operation. For the purpose of comparison, a single-crystal rod of the same size was manufactured according to FZ method and the conventional CZ method using an indirect melting process. The initial melting process in the latter method was conducted with graphite. The qualities of the respective single-crystal silicon rods are shown in Table 2. Power consumption and wear of dissolution reservoirs were compared between the direct and indirect melting processes.

As seen in Table 2, the direct melt process achieved power savings of about 40% of the indirect melting process. Also, the induction frequency, which is as low as 3 KHz, made the surface of the silicon melt stable and dispersion of the specific resistance uniform. Also, the initial dissolution process using the electron beam was adopted to cause no contamination of the single-crystal silicon with carbon, thereby providing the grown single-crystal silicon with quality equivalent to the conventional F method.

TABLE 1

| Requirements for electro-magnetic melting | Power frequency | 3 kHz |
|---|---|---|
| | Inner diameter of melt reservoir (Induction coil) | 150 mm |
| | Insulating material | $SiO_2$ (silicon dioxide) |
| | Thickness of insulating material | 0.2 mm |
| | Power output | 30 kw |
| | Melted silicon | 5.5 kg |
| | Type of magnetic shield | Annular molybdenum member (not cooled) |
| | Diameter of magnetic shield | 142 mm |
| | Height of magnetic shield | 30 mm |
| Requirements for pulling operation | Pull velocity | 2.0 mm/min |
| | Shield rotation | 20 rpm |
| | Rotation of melt reservoir | None |
| | Diameter of single-crystal silicon rod | 50 mm |
| | Type of semiconductor | P type, ab.1Ω · cm |

TABLE 2

| Evaluated items | a Indirect melting | a Direct melting | | FZ method |
|---|---|---|---|---|
| | | Graphite | Electron beam | |
| Power consumption | 75 kw | 30 kw | 30 kw | — |
| Wear of reservoir | None | None | None | — |
| Quality | | | | |
| Oxygen density | less than analysis limit | less than analysis limit | less than analysis limit | less than analysis limit |
| Carbon density | 2-7 × $10^{16}$ atoms/cc | 2-7 × $10^{16}$ atoms/cc | $10^{16}$ atoms/cc or less | $10^{16}$ atoms/cc or less |
| Lifetime | 100-150 μsec | 100-150 μsec | 250 μsec | 250 μsec |
| Dispersion of specific resistance | Nonuniform | Uniform | Uniform | Uniform |

In the dissolution reservoir 40 used in the above example, the induction coil 41 is closed at its bottom with the fireproofing bottom plate 42. The bottom plate may use an induction coil 45 as shown in FIG. 3.

Figure 3:
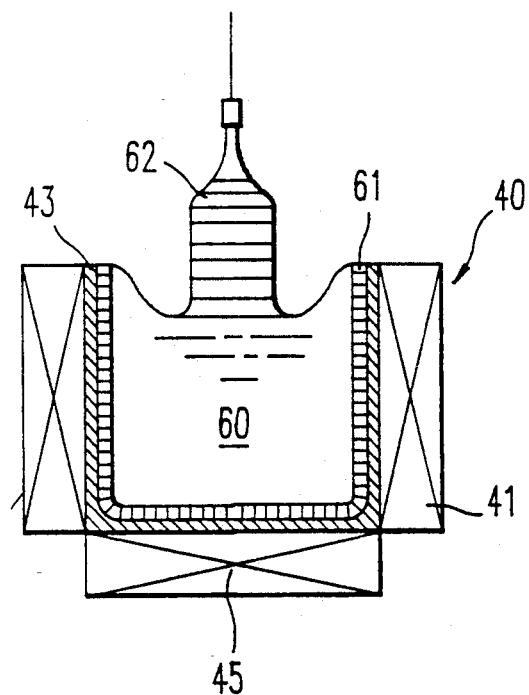
FIG. 3 is a schematic sectional view of a modified embodiment of the melt reservoir.

In the melt reservoir 40 shown in FIG. 3, the induction coil 45 is in a configuration of a pancake as coiled in the same direction as the induction coil 41 constituting the side wall to facilitate heating of silicon placed in the reservoir 40. The induction coil 45 may be provided with an insulating layer 43 similar to induction coil 41.

As can be ascertained from the evidence, the method of the present invention for preparing a single-crystal silicon provides advantages of exhibiting a notably higher power consumption efficiency, a superior quality single-crystal silicon product and no wear of the melt reservoir in which molten silicon is prepared; these advantages in comparison standing in contrast to the conventional CZ method which uses the electromagnetic melting process. Thus, the present invention provides a single-crystal silicon of high quality at a low cost, which facilitates the development of various silicon based electronic devices such as a highly effective solar battery, and the like.

Having now fully described the invention, it will be apparent to on of ordinary skill in the art that many changes and modifications can be made thereto without departing from the spirit or scope of the invention as set forth herein.

What is claimed as new and desired to be secured by Letters Patent of the United States is:

1. A method for preparing single crystal silicon, comprising:
    providing a silicon melt reservoir formed of an induction coil having a layer of a high melting insulating material on its internal surface;
    filling the reservoir with silicon raw material;
    melting the silicon in the reservoir by means of an external heating means and by the application of a branch current through the induction coil which contributes to the melting of a substantial portion of the silicon raw material into a silicon melt;
    stopping said external heating at a point determined beforehand and then stopping the application of current to the induction coil after enlarging the silicon being melted to a molten pool within the induction coil; and
    drawing a single crystalline rod of silicon up from the silicon melt by the CZ technique.

2. The method of claim 1, wherein a silicon skull layer is formed along the inner insulating surface of the induction coil when heating is stopped by the induction coil when the passage of current is stopped.

3. The method of claim 1, wherein the silicon melt is brought into contact with an inner surface of the melt vessel.

4. The method of claim 1, wherein said high melting point insulating material is formed of a silicon compound.

5. The method of claim 1, wherein the high melting point insulating layer is positioned between the coils of the induction coil.

6. The method of claim 1, wherein said external heating means is the application of an electron beam to the silicon material in the reservoir.

7. The method of claim 1, wherein the reservoir is replenished with silicon as granular silicon.

8. The method of claim 1, wherein the single crystal rod is drawn up under an inert gas atmosphere.

9. A method for preparing single crystal silicon, comprising:
    providing a silicon melt reservoir formed of an induction coil having a layer of a high melting insulating material on its internal surface;
    filling the reservoir with silicon raw material;
    melting the silicon in the reservoir by means of an external heating means and by the application of a branch current through the induction coil which contributes to the melting of a substantial portion of the silicon raw material into a silicon melt;
    stopping said external heating at a point determined beforehand and then stopping the application of current to the induction coil after enlarging the silicon being melted to a molten pool within the induction coil, thereby cooling the induction coil and a region of the molten silicon next to the insulating layer thereby forming a skull layer of silicon adjacent the insulating layer; and
    pulling up a single crystal silicon rod from the silicon melt in said melt reservoir.

10. The method of claim 9, wherein the thickness of the insulating layer is at least 0.15 mm but not more than 0.25 mm.

* * * * *